United States Patent [19]

Kohtani

[11] 4,311,369
[45] Jan. 19, 1982

[54] SOUND MOTION PICTURE CAMERA

[75] Inventor: Yutaka Kohtani, Yokohama, Japan

[73] Assignee: Canon Kabushiki Kaisha, Tokyo, Japan

[21] Appl. No.: 71,587

[22] Filed: Aug. 31, 1979

[30] Foreign Application Priority Data

Sep. 8, 1978 [JP] Japan ................................ 53-111063
Sep. 8, 1978 [JP] Japan ................................ 53-111065

[51] Int. Cl.³ ............................................. G03B 21/36
[52] U.S. Cl. .................................... 352/91 C; 352/27; 369/3; 360/66
[58] Field of Search ................. 352/91 C, 91 R, 91 S, 352/5, 27; 360/13, 66; 369/2, 3

[56] References Cited

U.S. PATENT DOCUMENTS

| | | |
|---|---|---|
| 3,950,083 | 4/1976 | Yoshimura et al. ............... 352/91 S |
| 3,972,604 | 8/1976 | Yoshimura et al. ............... 352/91 C |
| 4,006,975 | 2/1977 | Wagensonner et al. .......... 352/91 C |
| 4,106,864 | 8/1978 | Burgermann ..................... 352/91 C |

FOREIGN PATENT DOCUMENTS

| | | |
|---|---|---|
| 2740316 | 5/1978 | Fed. Rep. of Germany .... 352/91 C |
| 1396570 | 6/1975 | United Kingdom ............. 352/91 C |

Primary Examiner—Monroe H. Hayes
Attorney, Agent, or Firm—Toren, McGeady & Stanger

[57] ABSTRACT

In the disclosed sound motion picture camera, a sound overlap device keeps the sound level constant during a predetermined time after the start of a fade out operation, then gradually lowers the sound level and then gradually raises the sound level during the start of a fade in operation.

12 Claims, 16 Drawing Figures

SOUND MOTION PICTURE CAMERA

FIELD OF THE INVENTION

The present invention relates to a sound motion picture camera, and particularly, to an overlap device for effectively overlapping a new and a fading sound signal.

DESCRIPTION OF THE PRIOR ART

Quite recently, sound motion picture cameras capable of recording pictures and sounds at the same time have become available. In such sound motion picture cameras, the sound signals are recorded by a magnetic head, with a high frequency bias, on a magnetic portion formed at an edge of the film on which the pictures are recorded.

Presently, when scenes change in silent motion picture cameras, the preceding scene is gradually darkened, the film stopped and wound back so that the next scene overlaps the wound back part of the film, and the new scene gradually brightened. Other devices by means of which the sound signal could be recorded and overlapped during overlapping photography are known. In such devices, the pictures are gradually darkened for a scene change, while the sound signal is gradually decreased. (This process is hereafter called fading out or a fade out). The film is then stopped, rewound, and then the pictures of the next scene and the sound signal are recorded on the wound back part of the film. The new pictures are gradually brightened, while the new sound signal is gradually increased. (This process is called fading in or a fade in.)

However, in a conventional sound overlap device, a magnetic head records the sound signals with a high frequency bias, on the magnetic portion of the film. Hence, the sound signal of the next scene is overlapped with a high frequency bias so that the previously recorded sound signal is erased, which is undesirable.

Consequently, when sound fade out starts with the overlap operation and the newly recorded sound is gradually increased with a proper bias current during one fade in after the film is wound back, an adequate sound overlap effect cannot be obtained. Presently, only about 5 seconds is considered proper for the overlapping pictures. Further, in a camera using super 8 cartridge film, an overlapping operation longer than 5 seconds is difficult due to the construction of the cartridge. However, the time interval of about 5 seconds is too short for sound to get the feel of overlapping. Also, in a conventional device, if the sounds are overlapped in about 5 secs., the sounds in the middle part are not recorded so that often no sound overlap occurs. This can best be understood from the drawings.

Figure 1A:
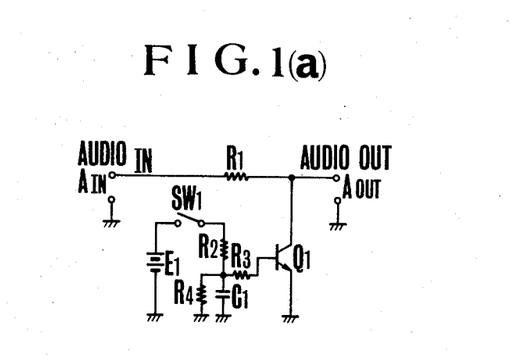
FIG. 1(a) shows an embodiment of the conventional sound overlap circuit.
Figure 1B:
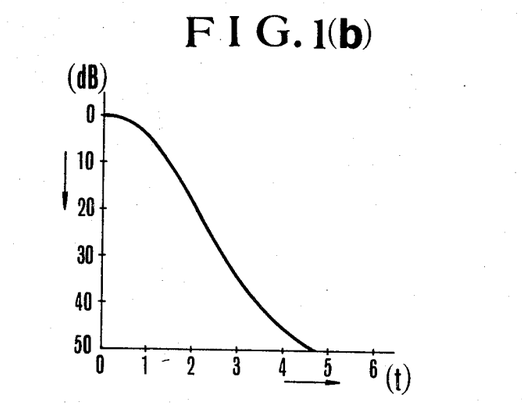
FIGS. 1(b) and (c) respectively show the characteristic curve for explaining the operation of the embodiment shown in FIG. 1(a).
Figure 1C:
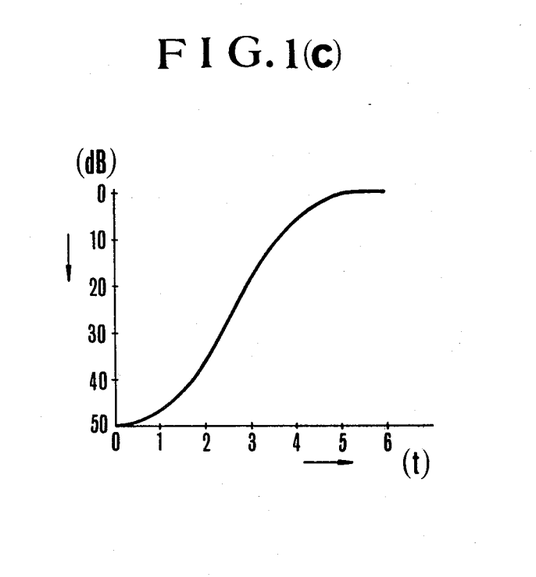

FIG. 1(a) shows a conventional circuit by means of which the sound signals are gradually decreased and increased (recovered). Here, the audio signal applied to the input terminal $A_{IN}$ is attenuated at the ratio determined by the ratio of the value of the resistance R1 to the impedance of the transistor Q1 and delivered from the output terminal $A_{OUT}$. The impedance of the transistor Q1 is varied by means of the potential applied to the base terminal. Closing of the switch SW1 causes the capacitor C1 to start charging from the D.C. source E1 through the resistance R2 so that the potential of the capacitor C1 is increased according to the lapse of time. Hence, the resistance R3 connected to C1 controls the base of the transistor Q1 so that the impedance of the transistor Q1 decreases with time. Thus, the sound signals are attenuated with time. For example, in a circuit constructed so that the sound signals are completely attenuated in 5 sec. (the signal which has been attenuated at 50 db, cannot be heard), the attentuation characteristic is as shown in FIG. 1(b). This attenuation characteristic is a preferable one for the auditory sense. When SW1 is opened, the charge stored in the capacitor C1 is discharged through the resistance R4 with time so that the impedance of the transistor Q1 is increased with time. Thus, the sound signals are increased with time. For example, in a circuit in which the sound signals are completely increased (restored) in 5 sec., the increase characteristic is as shown in FIG. 1(c). This attenuation characteristic is a preferable one for the auditory sense.

Figure 2A:
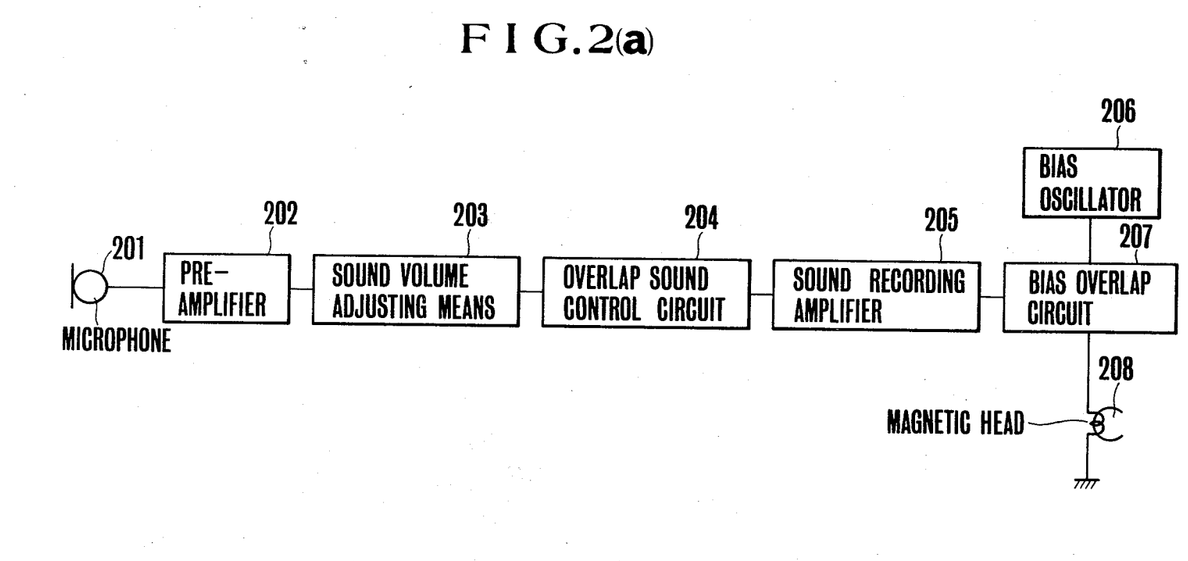
FIG. 2(a) shows an embodiment of the sound magnetic recording circuit for a sound motion picture camera having the overlap circuit shown in FIG. 1(a).

Now, let us suppose that such a circuit is used as the sound magnetic recording device for the sound motion picture camera shown in FIG. 2(a). FIG. 2(a) includes a microphone 201 for converting the sounds to be recorded into electrical signals, a pre-amplifier 202, the sound volume adjusting means or a device 203 composed of a volume or an automatic gain control circuit, an overlap sound control circuit 204 as shown in FIG. 1(a), a sound recording amplifier 205 including a sound recording equalizer, a bias oscillator 206, a bias overlap circuit 207 for overlapping the bias on the sound signals to be recorded, and a magnetic recording head 208 to be positioned along the film with a magnetic portion. The switch SW1 in the overlap sound control circuit is connected to the overlap operation member not shown in the drawing. The switch SW1 is closed at the time at which the overlap operation, namely the fade out operation starts, and opened at the time the fade in operation starts after the film has been wound back.

In the above mentioned structure, the sound signals from the microphone 201, which has been amplified by the pre-amplifier 202, has its volume adjusted by the sound volume adjusting means 203, and, when the overlap operation member is not operated, is further amplified by the sound recording amplifier 205. The sound is then overlapped with the bias from the bias oscillator by means of the bias overlap circuit and delivered to the magnetic head 208, so as to be recorded on the film in synchronization with the pictures. When the overlap operation member is operated during recording, the pictures are gradually darkened by means of a device not shown in the drawing, while the switch SW1 is closed, so that the sound signals are recorded, while being attenuated in accordance with the attenuation characteristics shown in FIG. 1(b) according to the lapse of time. This attenuation characteristic is shown in a dotted line (I) in FIG. 2(b).

When the pictures and the sounds have been faded out, the film is stopped and wound back up to the position at which the overlap is started, and the camera is stopped. Along with the start of the fade in, the pictures are photographed overlapped on the preceding scene in such a manner that the pictures are gradually brightened by means of the device not shown in the drawing, while the switch SW1 is opened. Then, the sound signals are thus recorded while being gradually increased with time in accordance with the characteristics shown in FIG. 1(c). This increasing characteristic is shown in (II) in FIG. 2(b). It is assumed from FIG. 2(b) that in the overlap range the sounds are recorded as is shown in (I) and (II). However, the signals, which have been recorded during the fade out, are more or less erased by the bias during the fade in so that the sounds are recorded as shown by the curve (III) in FIG. 2(b). Consequently, during sound reproduction, the sounds cannot be heard as overlapped, because during the 2 sec. from 1 sec. to 3 sec. after the start of the overlapping the sounds are attenuated more than 20 db out of the proper recording level. Under such circumstances, it sounds as if the next sounds rise only after the preceding sounds have disappeared. This is so because even if the sounds are recorded as shown in (I) and (II) in FIG. 2(b), the sounds cannot be heard as being overlapped (the sounds are attenuated about 20 db at the position of 2.5 sec.), while the preceding sounds are erased by the bias so that the effective sound overlap cannot be obtained.

Further, it is desirable, in order to make the sounds correspond to the pictures, as shown in FIGS. 1(b) and (c), the overlap time corresponds to the time during which the attenuation changes from 0 to about 50 db. Although it has not yet been mentioned, such an attenuation characteristic is preferred for controlling the sound volume for the simple fade in or the simple fade out (not the overlapping, but the gradual brightening of the initial scene (the gradual sound increase) or the gradual darkening of the last scene (the gradual sound attenuation) without the film wind back).

Figure 2B:
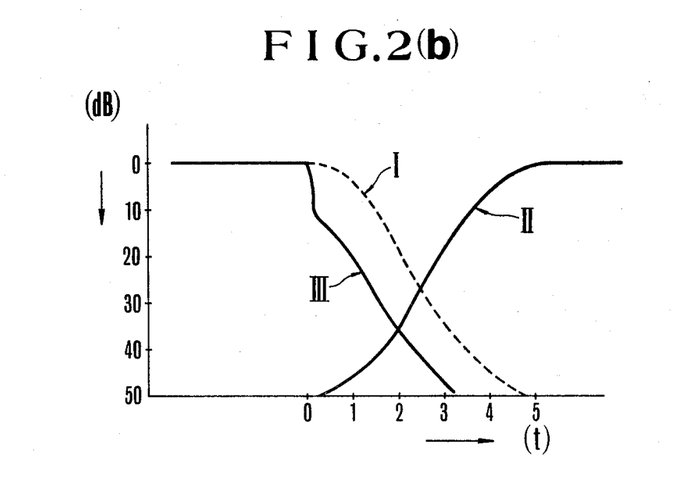
FIG. 2(b) shows a characteristic for explaining the operation of the embodiment shown in FIG. 2(a).
Figure 3A:
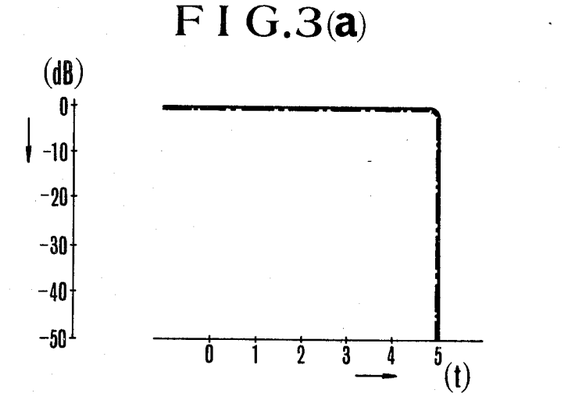
FIG. 3(a) shows a waveform for explaining the fade out operation of the sound.
Figure 3B:
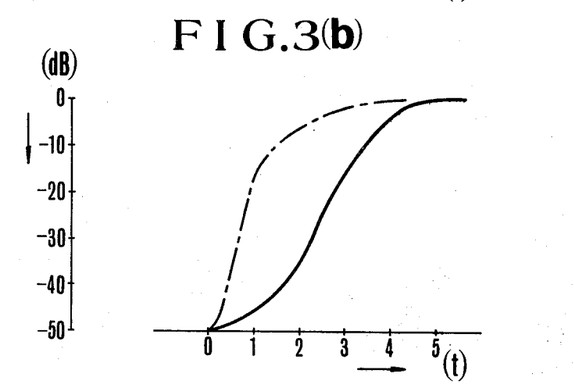
FIG. 3(b) shows a waveform for explaining the fade in operation of the sound.
Figure 3C:
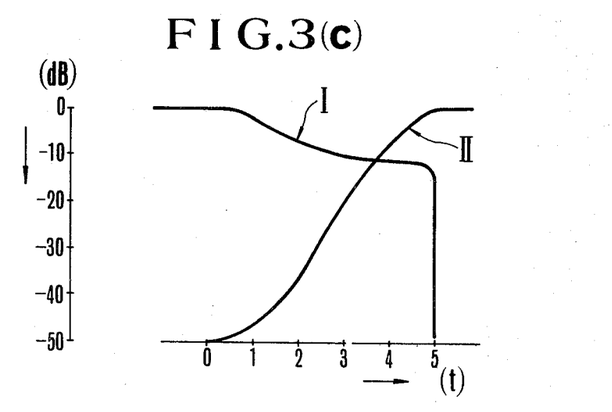
FIG. 3(c) shows a waveform for explaining the overlap operation of the sound.

As explained above, the conventional sound overlap device shown in FIGS. 1 and 2 is not preferable for the sound overlap. In view of the above mentioned shortcoming, a device having a characteristic as is shown in FIGS. 3(a) to 3(c) has been considered. Here, the sound erasing by high frequency bias is used positively. At the time of the fade out during the overlapping, the sounds (solid line) are not attenuated as shown in FIG. 3(a) and the bias current (in a dot-dash line) is kept at the proper value. During fade in after the film has been wound back the sound signals (solid line) are gradually increased as shown in FIG. 3(b) and the value of the bias current (dot-dash line) is also gradually increased. In this way, the recording is carried out as shown in FIG. 3(c). The curve (I) in the drawing illustrates the signal whose level has gone down by being erased by the overlapping bias. The curve (II) shows the fade in signal. When the sounds recorded in this way are reproduced, the sound overlap can effectively be felt. Although the characteristic shown in FIG. 3(c) is desired for the auditory sense when the sounds of the next scene exist (because the small sounds are marked with the large sounds due to the characteristics of the human auditory sense), when the next scene is silent, reproduction gives the impression that the preceding sounds stop suddenly. This is auditorily undesirable. In a motion picture camera, the sounds are very often overlapped so as to correspond to the pictures so that very often there are no sounds of the next scene or the sounds are soft. Thus, the characteristics shown in FIGS. 3(a) to 3(c) cannot be said to be ideal, although better than that of the device in FIGS. 1(a) to 2(b).

In a conventional sound overlap device, the sound recording level is almost zero from the termination of the fade out till the start of the fade in. Hence, during normal photography the sound level cannot be monitored at the start of the fade in after the termination of the fade out. This is disadvantageous.

SUMMARY OF THE INVENTION

An object of this invention is to overcome the aforementioned disadvantages.

Another purpose of the present invention is to provide a sound overlap device for a sound motion picture camera which attenuates the sound a predetermined time after the start of the fade out during the overlapping so that even when there are no or low sounds in the next scene, the preceding sounds do not end suddenly and so that even during a short time interval of about 5 sec. effective sound overlapping is possible.

Another purpose of the present invention is to provide a sound overlap device in which, during sound overlapping, the sound fade out operation starts a predetermined time after the start of the overlap so that the sounds are effectively recorded and overlapped.

Further, another purpose of the present invention is to provide a sound overlap device which, during the fade out of an overlap keeps the bias level constant and lowers the sound signal level a predetermined time after the start of the overlap, so as to fade out the sounds, while, during the fade in of the overlap, gradually raises the sound level and the bias level so as to carry out an effective sound overlap.

Yet another purpose of the present invention is to provide a sound overlap device which restores the sound signal level to the normal level after the termination of the fade out, while at the time of the fade in operation, brings the sound immediately back to the state after the termination of the fade out so as to enable the monitoring of the sounds after the termination of the fade out.

Other purposes and advantages of the present invention will become evident out of the following detailed description to be made in accordance with the accompanying drawings.

BRIEF DESCRIPTION OF THE DRAWINGS

FIGS. 6(a), (b) and (c) respectively show a diagram for explaining the operation of the circuit shown in FIGS. 4(a) and (b).

DESCRIPTION OF PREFERRED EMBODIMENTS

Figure 4A:
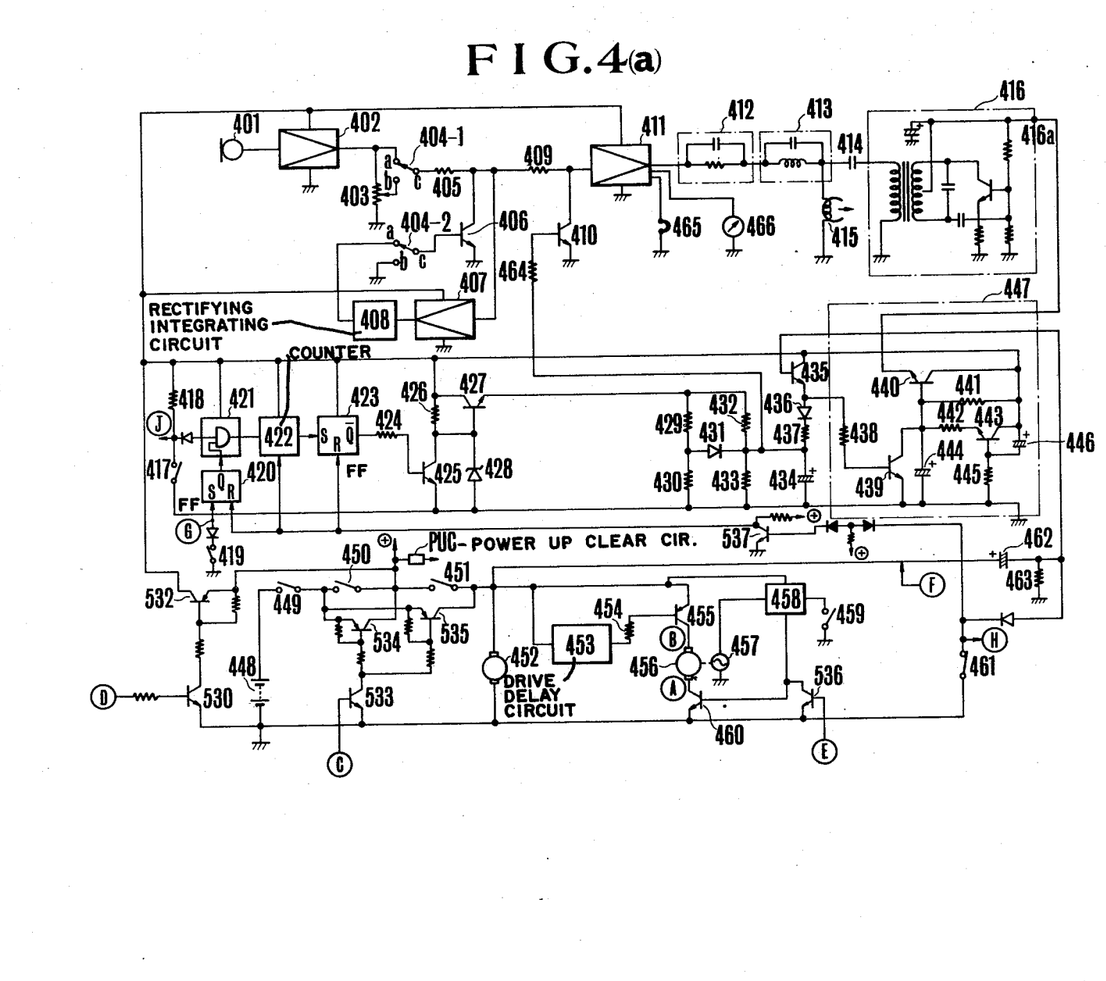
FIGS. 4(a) and (b) show an embodiment of the circuit of the sound motion picture camera having the sound overlap device in accordance with the present invention.

In FIG. 4(a), microphone 401 converts the sound to be recorded into an electrical signal and is connected to a preamplifier 402. A volume control 403 manually controls the sound value and selector switches 404-1 and 404-2 select manual or automatic sound volume control. The switches 404-1 and 404-2 include contacts a, b and c so as to set for automatic volume control when the contacts a-c are connected and manual volume control when the contacts b-c are connected. FIG. 4(a) further includes a resistance 405 and a variable impedance element 406 such as a transistor which together form an automatic gain control circuit for automatically controlling the volume by means of the ratio of the value of the resistance 405 to the impedance of the variable impedance element 406. An amplifier 407 feeds back the automatic gain control signal and a rectifying integrating circuit 408 serves for rectifying and integrating the output of the preamplifier 407 so as to supply the automatic gain control signal to the variable impedance element 406. A resistance 409 and a variable impedance element 410 such as a transistor control the increase or decrease of the sound volume during overlap by means of the ratio of the value of the resistance 409 to the impedance of the variable impedance element 410.

The circuit of FIG. 4(a) also includes a sound recording amplifier 410, a constant current equalizer circuit 412 composed of a parallel circuit of a resistance and a capacitor and a trap circuit 413. The latter is composed of a parallel resonance circuit to block the bias current to be supplied from a bias oscillator 416 to a magnetic head 415 through a capacitor 414. The capacitor 414 serves for allowing the passage of the bias current from the bias oscillator 416 to the magnetic head 415. The magnetic head 415 serves for recording the sound signal on the magnetic portion of the film not shown in the drawing. The high frequency bias oscillator 416 which supplies a bias current to the magnetic head 415 has a terminal 416a supplied with the source voltage from a circuit 447.

A switch 417 is to be opened and closed every time the film not shown in the drawing is fed one picture frame by the film feeding mechanism operatively engaged with a claw feed motor 456 to be explained later. A resistance 418 has one terminal connected to the power source and another terminal connected to the switch 417 so as to supply one pulse (hereinafter called picture frame feed pulse) to a gate circuit 421 in operative engagement with film feeding every time one picture frame is fed. A switch 419 is closed at least during the fade out and operates in engagement with the overlap operation member of the camera not shown in the drawing. (The switch may be opened at the time of the fade in operation.) A flip-flop 420 is set when the switch 419 is closed, and reset by a pulse from the power clear circuit PUC when a switch 461 to be explained is opened and when a release switch that responds to the start of a release stroke is closed. Thus, the opening signal is supplied to a gate circuit 421 to be explained later while the flip-flop 420 is being set. The gate circuit 421 controls the supply of the picture frame feed pulse from the resistance 418 and the switch 417 to a counter 422. Hence, the picture frame feed pulses are supplied to the counter 422 while the flip-flop 420 is being set. The gate circuit is, for example, in the form of an AND gate.

The counter 422 counts the number of pulses supplied from the gate circuit 421. The counter 422 is reset by the pulse from the power up clear circuit PUC, which pulse is produced when the switch 461 is opened. After having counted a given number of pulses, the counter produces an output pulse from the output terminal. A flip-flop circuit 423 is set by the output pulse from the output terminal of the counter 422 and reset when the release first position responsive switch is closed and when the switch 461 is opened. It is assumed that the flip-flop produces a low signal from the output terminal Q when it is set and a high signal when it is reset.

A resistance 424, a transistor 425, resistance 426, a transistor 427, and a Zener diode 428 form a voltage control circuit in which the emitter of the transistor 427 exhibits a given voltage determined by the Zener diode 428 and the transistor 427 regardless of the fluctuation of the source voltage when the flip-flop 423 produces a low level output. The potential at the emitter terminal of the transistor 427 is almost zero when the flip-flop 423 produces a high level output.

Resistors 429, 430, 432, 433, and 464, diode 431, and a condenser or capacitor 434 form a circuit for producing a signal for controlling the variable impedance element 410 controlling the increase or decrease of the sound volume during an operation. The resistances 432 and 433 respectively serve to charge the capacitor when the emitter of the transistor 427 produces a predetermined voltage (for example 4V in FIG. 6(a)) and discharge the charge in the capacitor when then the transistor 427 is non-conductive. Hence, their values are set in accordance with the fade out and the fade in time (for example 5 sec.) in the overlap operation. The resistances 429, 430 and the diode 431 constitute a circuit for charging the capacitor 434 up to the value of the forward voltage component between the base and the emitter of the transistor at starting to charge the capacitor 434, so that the transistor 410 immediately assumes the active state. The values of the resistances 429 and 430 are chosen so that they are small as compared with the values of the resistances 432, 433 (for example 1/10) and that the potential at the connecting point of the resistances 429 and 430 is a little smaller (for example, 1.2 V in FIG. 6(b)) than the sum of the forward voltages between the base and the emitter of the transistor 410 and diode 431.

A transistor 435, a diode 436, a resistance 437, a condenser or capacitor 462, a resistance 463, and a switch 461 form a circuit for quick fade out immediately before the fade in for overlap operation. A circuit 447 supplies the source voltage to the terminal 416a of the bias oscillator 416 in such a manner that at the time of the fade in of the overlap operation the source voltage is increased slowly, so as to slowly increase the oscillation level of the bias oscillator. The circuit 447 is composed of the transistors 439, 440, 443, the condensers 444, 446 and the resistances 438, 441, 442, 445. A D.C. source 448 such as a battery drives the circuitry for the whole camera through a power source switch 449. A first position responsive release switch 450 is closed with the first portion of the stroke of the release member of the camera not shown in the drawing. Along with the closing of the switch 450, the current is supplied to the sound recording circuit and the exposure control circuit not shown in the drawing.

A release switch 451 is closed with the second portion of the stroke of the release member of the camera not shown in the drawing. With closing of the switch 451, current is supplied to a capstan motor 452 to be explained and a claw feed motor 456. Current supply to a capstan motor 452 and the claw feed motor 456 causes the film to feed and the photographing operation starts. The capstan motor 452 drives the pinch roller and the capstain to drive the film at the aforementioned magnetic head 415 at a constant speed.

A drive delay circuit 453 controls the voltage at a resistance 454 and a switching transistor 455. From the closing of the switch 451 and starting the capstan motor, the circuit 453 imposes a delay corresponding to the time needed for the film to travel between the claw feed member not shown in the drawing and the magnetic head 415. The delay circuit then allows start of the claw feed motor 456. The claw feed motor 456 drives the film ejector, the shutter and the like in such a manner that the pictures are taken at the aperture portion not shown in the drawing. The circuit includes a tacho-generator for producing an output corresponding to the number of rotations of the claw feed motor, a conventional motor control circuit 458, a conventional loop sensor 459 and transistor 460. The number of rotations of the claw feed motor 456 is controlled by means of the loop sensor 459, the tacho-generator 457, the motor control circuit 458 and the transistor 460 to establish a proper loop between the claw feed member and the magnetic head 415.

A normally closed switch 461 is opened and closed in operative engagement with the overlap operation of the picture overlap device not shown in the drawing, such as the control device operating on the basis of the shutter opening angle and disclosed in the Japanese patent application No. Sho 52-101259 of the inventor of the present invention. The switch 461 is opened when the picture has completely been faded out, kept open till the film has been fed back and restarted, namely when the fade in operation has been started, and closed at the start, namely when the shutter opening angle starts to increase. Member 465 is an earphone and 466 a sound signal monitor such as a level meter. The motor 456 serves to feed the film at the speed of 18 picture frames/sec.

Figure 4B:
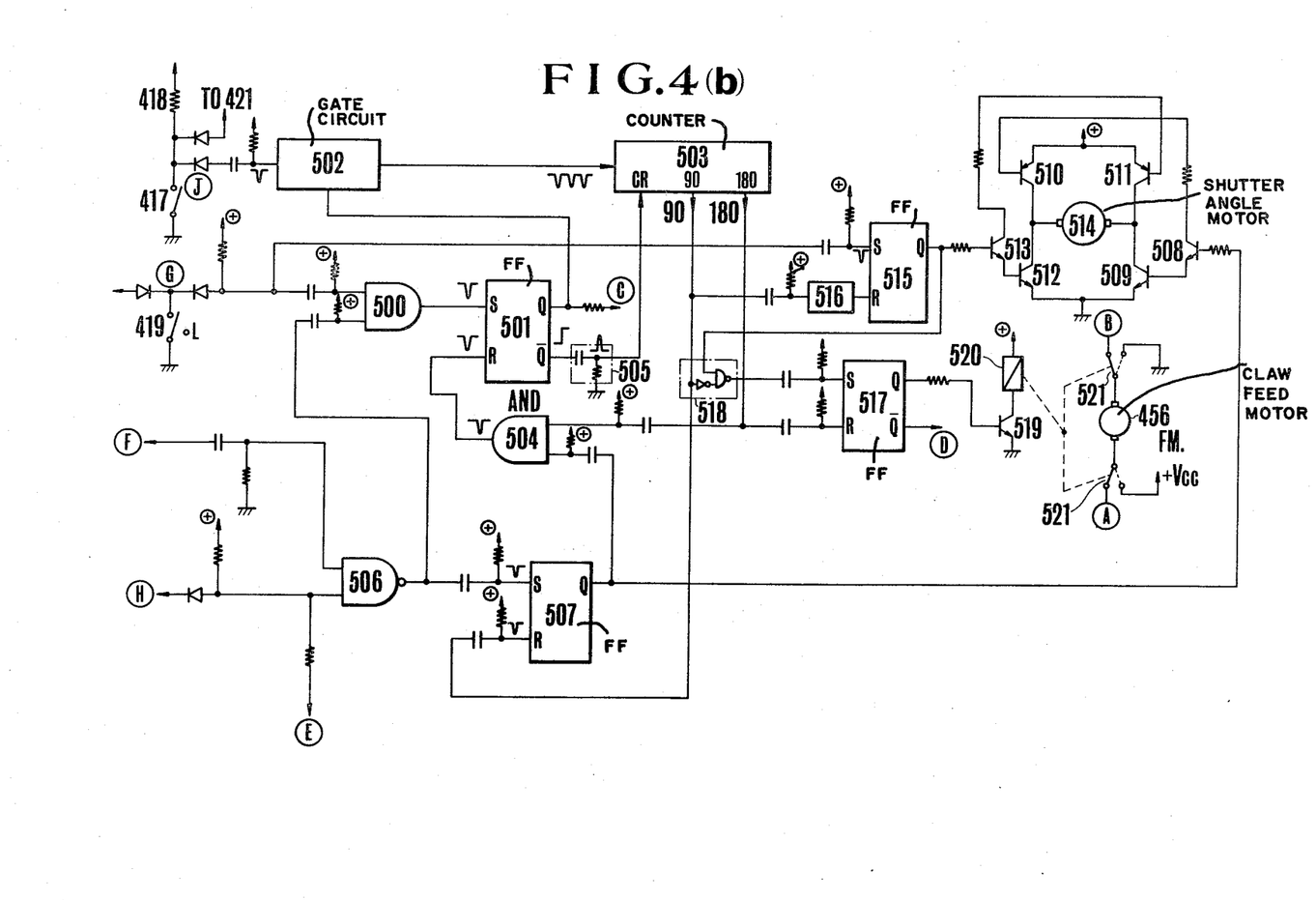

FIGS. 4(a) and (b) constitute the circuit diagram of the motion picture camera. The contact points (A)–(J) in FIG. 4(a) are respectively connected to the contact points (A)–(J) in FIG. 4(b). In FIG. 4(b), an AND gate 500 has respective input terminals to each of which a differentiating circuit composed of a resistance and a capacitor is connected. The set terminal S of a flip-flop 501 is connected to the output terminal of the AND gate 500. The flip-flop 501 produces a high level signal from the output terminal Q in response to a negative pulse from the AND gate 500. A gate circuit 502, composed of, for example, an AND gate, is connected to the counter 503 to transmit pulses produced by opening and closing of the switch 417 in response to the high level signals from the output terminal Q of the flip-flop 501.

The respective input terminals of an AND gate 504 each receive the output of a differentiating circuit composed of a resistor and a capacitor. Further, the output terminal of the AND gate 504 is connected to the reset terminal R of the flip-flop 501. The flip-flop 501 is constructed to be reset with the negative pulse from the output terminal of the AND gate 504. A differentiating circuit 505, composed of a capacitor and a resistance, is connected to the output terminal $\overline{Q}$ of the flip-flop 501 so as to produce a positive pulse when the flip-flop 501 is reset. The positive pulse is transmitted to the clear terminal CR of the counter 503 so as to clear the counter 503. A NAND gate 506 is connected at one input terminal to a differentiating circuit composed of a resistance and a capacitor and at the other input terminal to the switch 461 through a diode. The differentiating circuit is connected to the switch to be closed at the second portion of the release stroke so as to produce a positive pulse when the switch 451 is closed. The NAND gate 506 produces a low level signal in response to the second portion of the stroke when the switch 461 is opened, namely the opening angle of the shutter is null.

The output terminal of the NAND gate 506 is connected to the input terminal of the AND gate 500 through the differentiating circuit and also to the set terminal of the flip-flop 507 through a differentiating circuit both composed of a capacitor and a resistor. The flip-flop 507 is set in response to the low level signal from the NAND gate 506 so as to produce a high at the output terminal Q. This high level signal is supplied to the base of the transistor 508 forming part of a driving circuit 508–513 for the motor 514 for driving the shutter opening angle control device not shown. Further, the reset terminal R of the flip-flop 507 is connected to the output terminal 90 of the counter through a resistor-capacitor differentiating circuit so that the flip-flop 507 is reset in response to the low level signal from the output terminal 90 of the counter 503.

The terminal S of a flip-flop 515 is connected to the switch 419 through a resistor-capacitor differentiating circuit and a diode so that the flip-flop is set by closing the switch 419. The reset terminal R of the flip-flop 515 is connected to the output terminal 90 of the counter 503 through a delay circuit 516 and a resistor-capacitor differentiating circuit so that the flip-flop 515 is reset by means of the low level signal from the output terminal 90 of the counter 503. The output terminal Q of the flip-flop 515 is connected to the base of a transistor 513 in the driving circuit, so as to drive the angle opening motor in the direction along which the shutter opening angle is decreased. The set terminal S of a flip-flop 517 is connected to the output terminal 90 of the counter 503 through a resistor-capacitor differentiating circuit and a gate circuit 518, whose one input terminal is connected to the output terminal 90 of the counter 503 and whose other input terminal is connected to the output terminal Q of the flip-flop 515. The gate circuit 518 is, for example, composed of a NAND gate and an inverter so as to produce a low level signal in response to the low level signal from the output terminal 90 of the counter 503 only when the flip-flop 515 produces a high level signal at the output terminal Q. In consequence, the flip-flop 517 is set when the flip-flop 515 produces a high level signal at the output terminal Q and the counter 503 produces a low level signal at the output terminal 90, so as to produce a high level signal at the output terminal Q. The reset terminal R of the flip-flop 517 is connected to the output terminal 180 of the counter 503 through a resistor-capacitor differentiating circuit so that the flip-flop is set by means of a low level signal from the output terminal 180.

A transistor 519 is connected to the output terminal Q of the flip-flop 517 so as to actuate the relay 520 when the flip-flop 517 is set. A switch 521 is switched out of the position shown by a rigid line into that in a dotted line by operation of the relay 520. A motor 456 runs in reverse when the switch 521 is changed into the dotted line position. The counter and the flip-flop in FIG. 4(b) are reset by means of the pulse from the power up clear circuit in FIG. 4(a).

In operation, the main switch 449 is closed so as to operate the camera, while the release lever not shown in the drawing is pushed down to the first position or portion of its stroke so as to close the release switch 450 in order to supply current to the sound recording circuit composed of members 401–416, 465, the sound overlap circuit composed of members 417–447 and the exposure control circuit not shown in the drawing. Thus, the power up clear circuit PUC is actuated so as to reset the counter and the flip-flop in FIG. 4(b). In consequence, a high level signal is produced from the output terminal Q of the flip-flop 517 in FIG. 4(b) so as to close, i.e., turn on the transistors 530 and 532 and supply current to each circuit.

Thus, the sound recording circuit and so on assume the state ready for operation. The volume of the sound signal from the microphone, which has been amplified by means of the preamplifier 402, is adjusted by sound volume adjusting means. Manual adjustment is accomplished by the volume control 403 with the contacts b–c of the switches 404-1, 404-2 connected to each other. Automatic adjustment is accomplished by the resistance 405, the amplifier 407 and the rectifying integrating circuit 408 and the transistor 406 when the contacts a–c of the switches 404-1, 404-2 are connected to each other. Volume is further increased by the sound recording amplifier 411.

When the release stroke reaches the first position (or portion) the condenser 446 is charged through the resistance 445, so that the transistor 443 is closed, i.e., on, for a moment so as to charge the capacitor 444. Thus, the transistor 440 turns on to apply the voltage of the power source 448 to the terminal 614a of the bias oscillator 416. Thus, the bias oscillator 416 becomes ready for operation when the release stroke reaches its first position. The sound signal, which has been amplified by the amplifier 411, is overlapped through the constant current equalizer circuit 412 and the trap circuit 413 with the high frequency bias supplied from the bias oscillator 416 through the condensor or capacitor 414 and delivered to the head 415. In consequence, the sound recording circuit assumes an operationally ready state at the first position or portion of the release stroke. At this time, the amplifier 411 applies the sound signal to the monitor device 465 so that the sound is monitored.

Further operation of the release lever to the second position or portion of the release stroke closes the switch 451. Thus, the capstan motor 452 starts to run, the delay circuit 453 starts to operate and after the time delayed by means of the circuit 453, a low level signal is produced from the delay circuit 453, the transistor 455 is closed, i.e., turned on, so that the motor 456 starts to run. Start of the motor 456 initiates feeding the film so that the picture and the sound are recorded normally.

At this time, the base of the transistor 435 is connected to the switch 461 so that the transistor 435 is kept in the non-conductive state as long as the switch remains closed. Even if the switch 451 is closed at the second position of the release stroke and charges the capacitor 462 the transistor 435 does not become conductive. In consequence, the capacitor 434 is not charged, the transistor 410 remains in the non-conductive state and therefore the sounds are not attenuated by the transistor 410 and transmitted to the amplifier 411 at the normal level. Furthermore, because the transistor 435 remains non-conductive, the transistor 439 also remains non-conductive and the charge on the condenser 444 is maintained. In consequence, at the second position of the release stroke the state of the transistor 440 is not changed nor is the output level of the bias oscillator changed. Thus, the sound recording and photography are carried out at the normal level.

When the overlap operation member not shown in the drawing is operated in order to start the overlap photography while the sound and pictures are recorded at the normal level, the switch 419 in operative engagement with the overlap member is closed. Thus, the flip-flop 420 is set and opens the gate circuit 421 so that the picture frame feeding pulses formed by the resistance 418 and the switch 417 are delivered to the counter 422 through the gate circuit 421. Thus, the counter 422 starts to count until the preset number. At that time, flip-flop 423 is set. It is desirable that the count number be set so as to correspond to the amount of film needed for overlapping, for example, 48 picture frames which is about a half of 90 pictures. However, the number is set at a value most preferable for hearing. Thus, after T sec. (Preset counter number/Film feeding speed), for example, 2.7 sec. when 18 picture frames per sec. are used, the flip-flop 423 is set.

Figure 5A:
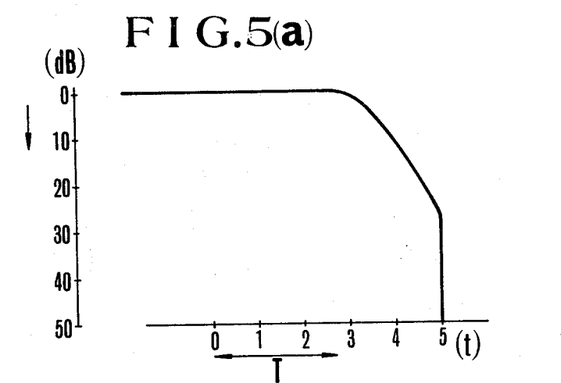
FIG. 5(a) shows a waveform for explaining the fade out operation of the device shown in FIGS. 4(a) and (b).
Figure 6:
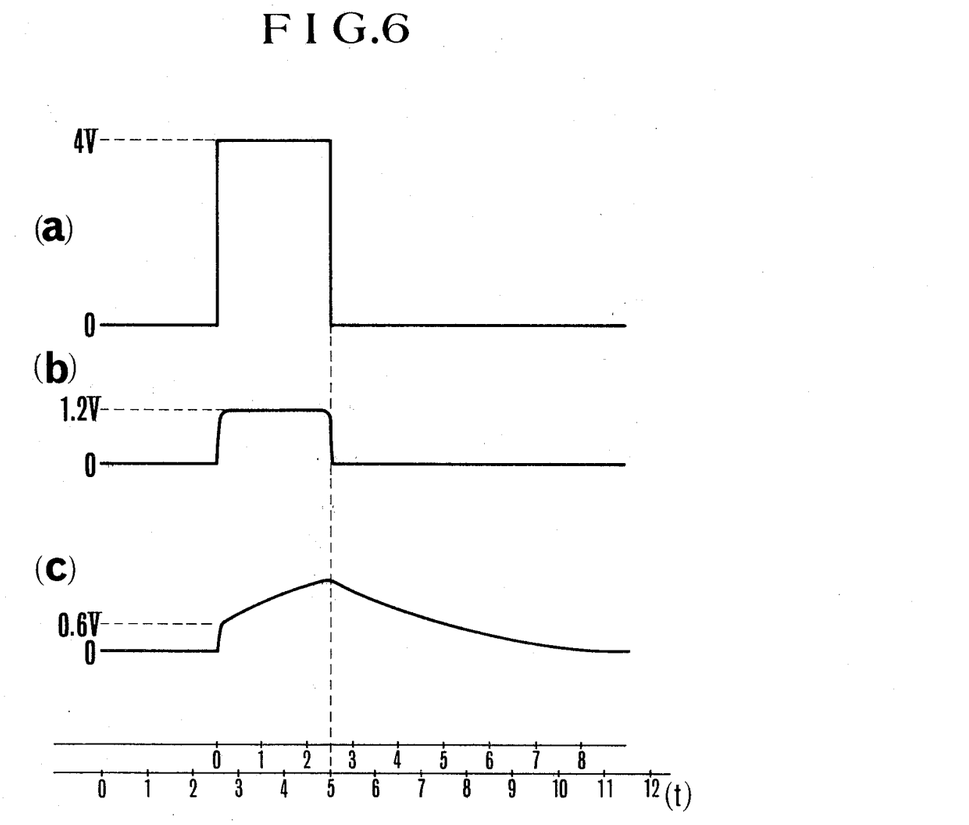

When the flip-flop 423 is set this way after a predetermined time from the start of the overlap, the transistor 425 which has been conductive assumes the non-conductive state. The base potential of the transistor 427 now rises to the level determined by means of the Zener diode 428 so as to make the transistor 427 conductive. The emitter potential of the transistor 427 now becomes constant, for example, 4V in (FIG. 6(a)), and the capacitor 434 is quickly charged by means of the resistances 429, 430 and the diode to the potential determined with the ratio of the resistance 429 to 430 minus the forward potential of the diode 431 and then continues to charge through the resistance 432 as is shown in FIG. 6(c). Charging of the capacitor 434 makes the transistor 410 conductive and lowers the impedance between its collector and emitter. Lowering the impedance between the collector and the emitter of the transistor 410 attenuates the sound signals at the ratio of the impedance to the value of the resistance 409. Hence, during the time T after the start of the overlap operation, the transistor 427 serves to cut off transistor 410 and as shown in FIG. 5(a) the sound signals are not attenuated. After the lapse of the time T, i.e., from the start of the overlap till the counter 422 starts to count and the count value reaches a predetermined value and the flip-flop 423 is set, the sound signals are gradually attenuated. On the other hand, the output level of the bias oscillator is kept constant because the transistor 435 remains off.

In this way, as shown in FIG. 5(a), the sound signals are gradually attenuated so as to fade out, while the pictures are also caused to fade out by the picture overlap device so that the sound signals and the pictures fade out together. That is, when the switch 419 is closed at the time of the overlap operation the differentiating circuit connected to the set input terminal of the flip-flop 515 in FIG. 4(b) applies a negative pulse to the set terminal S. Consequently, the flip-flop 515 is set so as to turn on transistors 513, 512 and 511. Thus, the shutter angle motor 514 rotates in the direction along which the shutter opening angle is narrowed so as to make the pictures fade out.

With the closing of the switch 419 a negative pulse is applied from the differentiating circuit to one input terminal of the AND gate 500 so that the AND gate 500 also delivers a low level signal for a moment. This low level signal set the flip-flop 510 and its output terminal Q delivers a high level signal to the gate circuit 502. Thus, the gate circuit 502 is opened so that pulses whose number corresponds to the picture frame feeding are delivered from the picture frame feeding pulse producing circuit composed of the switch 417 and the resistance 418 to the counter 503 through the gate circuit 502. The picture frame number counting operation is carried out by means of the counter 503. When the counter 503 has counted 90 pulses after the start of the picture and the sound fade out operation in this way, that is when the fade out operation has continued for 90 picture frames, a low level signal appears at the output terminal 90 of the counter 503 and is applied to the inverting input terminal of the gate circuit 518. The output terminal Q of the flip-flop 515 applies a high to the other input terminal of the gate circuit 518, which delivers a low level signal in response to the low level signal from the output terminal 90 of the counter 503. The differentiating circuit at the output of gate circuit 518 now starts to operate, the flip-flop 517 is set, the transistor 519 conducts, the relay 520 operates and the switch 521 is set to the position shown by the dotted line. The low level signal from the output terminal 90 of the counter 503 is also delivered to the reset terminal R of the flip-flop 515 through a differentiating circuit and the delay circuit 516 so that the flip-flop 515 is reset, the motor 514 stops and the picture fade out operation is terminated.

The value of the resistance 432 is set so that the fade out operation of the sound is terminated at the same time with that of the pictures so that the fade out operation of the pictures and that of the sound terminate at the same time. Further, the switch 461 opens when the fade out of the pictures terminate, namely the shutter angle is totally closed. Consequently, the flip-flop 420 and 423 and the counter 422 are reset. On the other hand, opening of the switch 461 causes the connection of the capacitor 462 with the switch 461 to float above ground. Hence, due to the resistance 463 the potential does not change and the transistor 435 remains non-conductive. When the flip-flop 423 has been reset, the transistor 425 assumes the conductive state, while the transistor 427 assumes the non-conductive state. Thus, the condenser 434 is no longer charged, while the charge in the condenser 434 is discharged through the resistance 433. (FIG. 6(c).)

On the other hand, the switch 521 is turned to the position of the dotted line at the termination of the fade out so that the motor 456 rotates in the reverse direction so as to carry out the film rewinding operation. At this time, the counter 503 continues to the count even after the termination of the fade out until the count value reaches 180, namely 90 has been counted after the fade out, when a low level signal is delivered from the output terminal 180 of the counter 503. A differentiating circuit now resets the flip-flop 517. Thus, the motor 456 which has rotated in reverse so as to rewind the film 90 picture frames the transistor 519 being turned off and the relay 520 no longer being unexcited, the switch 521 is moved into the position of the rigid line so as to terminate the film rewinding operation of the motor 456.

At this time, the switch 461 remains opened as mentioned above, so that the  terminal delivers a high level signal and the transistor 536 is on. Thus, the transistor 460 turns off after termination of the fade out, so that even if, after the termination of the film rewind, the switch 521 is turned back into the solid line position the motor 456 does not start to run in such a manner that the photography is interrupted. Further, the output terminal $\overline{Q}$ of the flip-flop 517 delivers a low level signal during the film rewind operation so that the transistors 530 and 532 remain off during film rewind. This interrupts the current supply to the sound recording circuit. Consequently, the sound recording is disabled during the film rewind operation. Further, the transistor 535 remains on until the film rewind operation has been terminated so that even if the release operation is stopped during the fade out, the fade out operation and the film rewind operation can be carried out. That is, since the switch 419 is closed at the time of the overlap the flip-flop 501 remains set until the counter has counted 180 pulses. A low level signal is now delivered from the output terminal 180 of the counter 503 and a negative pulse is delivered to the reset terminal of the flip-flop 501 through the differentiating circuit and the AND gate 504, so that the transistors 533, 534 and 535 remain on till the termination of the film rewinding operation in such a manner that regardless of the release state, the current is supplied to every circuit. Consequently, independently ent of the release state, the fade out operation and the film rewind operation can be carried out.

After the termination of the film rewinding operation in this way the motion picture camera is directed toward the object to be faded in and the release lever is again pushed. Upon reaching the first position of the stroke the switch 450 is again closed. Consequently, the current is again supplied to the sound recording circuit through the transistor 532 in the same way as in the above-mentioned case so that the sound is monitored by means of the sound monitoring device such as the earphone 465, the level meter 466 and so on. As mentioned, the charge on the capacitor 434 has been discharged by the termination of the fade out operation so that the transistor 410 is off, the sound signal is transmitted to the earphone 465 and the level meter 466 at the sound level of normal photography and, therefore, the sound for the picture to be faded in can be monitored before the fade in operation. When the sounds have been monitored before the fade in photography, the release lever is pushed down further to the second position of the stroke in such a manner that the switch 451 is again closed. Consequently, the capstan motor 452 again starts to rotate, while the motor 456 starts to rotate after the lapse of the time determined by the delay circuit 453 as explained so as to start photography. On the other hand, at this time, the switch 461 is opened as explained so that closing of the switch 451 causes current to be supplied to the condenser 462 through the resistance 463. Hence, the potential at the point connecting the capacitor 462 with the resistance 463 goes high during the time established by the time constant of the condenser 462 and the resistance. Consequently, the transistor 435 becomes conductive and capacitor 434 is charged through the diode 436 and the resistance 437. On the otherhand, when the transistor 435 has become conductive the transistor 439 becomes conductive and the charge in the condenser 444 is quickly discharged, so that the transistor 440 becomes non-conductive and the bias oscillator 416 stops oscillating. Charging of the condenser 434 raises the potential at the base of the transistor 410 and hence lowers the impedance between the collector and the emitter of the transistor 410. Consequently, the sound signals quickly reduced after the release operation.

The aforementioned operation occurs within the delay time of the delay circuit 453. On the otherhand, the motor 456 is made ready for operation after the lapse of the time determined by the delay circuit 453. Consequently, at the time of the fade in operation after the release the impedance of the transistor 410 assumes the value at the termination of the fade out operation. The motor 456 then starts to run so as to carry out the fade in operation.

Upon closing of the switch 451 at the second position of the release stroke a high level signal is applied to the Ⓕ contact, and a high level signal is applied from the differentiating circuit to the one input terminal of the NAND gate 506. On the other hand, at this time, the switch 461 remains opened so that a high level signal is also applied to the other input terminal of the NAND gate 506. Thus, the flip-flop 507 is set by means of the differentiating circuit, the transistors 508, 509, 510 are turned on and the shutter angle motor 514 starts to rotate in the direction along which gradually opens the shutter angles from the totally closed shutter angle and the picture fade in operation starts. On the other hand, along with the opening of the totally closed shutter angle the switch 461 is again closed. Thus, a low level signal is delivered from the contact Ⓔ in FIG. 4(b) so as to turn off the transistor 436 and turn on the transistor 460. The delay circuit now delivers a low so as to turn on the transistor 455. The motor 456 starts to rotate at the same time as the start of the fade in operation so as to feed the film forward in such a manner that the fade in photography is carried out. In this way the picture and the sound fade in operation can be carried out. When the switch 461 is again closed at the time of the fade in operation as mentioned above, the transistor 435 assumes the non-conductive state. Thus, the charge of the condenser 434 is gradually discharged through the resistance 433. The impedance of the transistor 410 is now gradually increased so the sound signals fade in gradually as shown by curve (I) in FIG. 5(b).

Figure 5B:
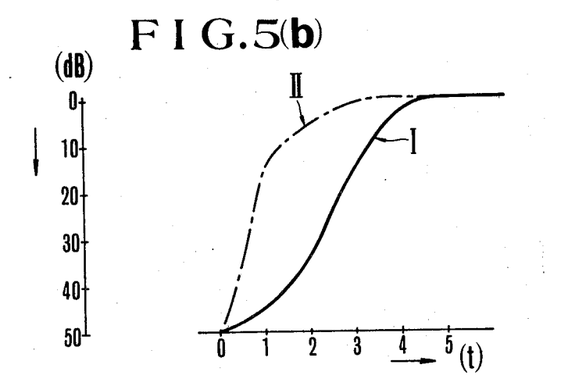
FIG. 5(b) shows a waveform for explaining the fade in operation of the device shown in FIGS. 4(a) and (b).

On the other hand, when the transistor 435 has become non-conductive, the transistor 439 becomes non-conductive, and the capacitor 444 is gradually charged through the resistance 441 so as to gradually raise the mitter potential of the transistor 440. Thus, the level of the output of the bias oscillator 416 is gradually raised, while the bias current flowing through the magnetic head is gradually increased as is shown in FIG. 5(b) (II) so as to cause fade in of the sounds.

The fade in operation is carried out in this way for the 90 picture frames in order to overlap the sounds on the 90 picture frames. The NAND gate 506 delivers a low level signal as mentioned at the time of the fade in operation, while a negative pulse is delivered from the AND gate 500 by means of the differentiating circuit so as to set the flip-flop 501. Thus, the circuit 502 is again opened at the start of the fade in operation so as to deliver pulses, whose number corresponds to the amount of feed of the film, to the counter 503. The counter 503 counts the picture frame feed pulses after the start of the fade in operation until the 90 picture frames of the film has been reached, when a low level signal is delivered from the output terminal 90.

Figure 5C:
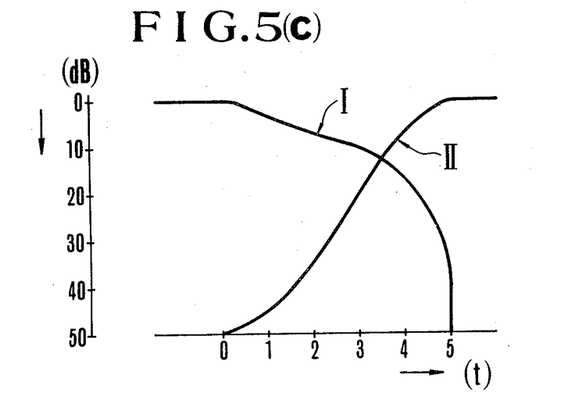
FIG. 5(c) shows a waveform for explaining an overlap operation of the embodiment shown in FIGS. 4(a) and (b).

When the fade in operation has been carried out for 90 picture frames, the flip-flop 507 is reset, the transistors 508, 509 and 510 are turned off and the motor 514 stops running so as to determine the shutter angle control. Thus, the fade in operation is made for the pictures faded out so as to overlap the pictures. On the other hand, the discharge time of the condenser 434 is determined so as to correspond to the feed time for the 90 picture frames, so that the sound fading operation is carried out for the sound fade out so as to overlap the sounds. The overlapping operation is carried out in this way. During the sound fade in operation, the value of the bias current is increased as shown in FIG. 5(b) (II), so that the recorded sound is gradually decreased during the fade out operation as is shown in FIG. 5(a). Consequently, the sound recording level during the fade out operation follows the level shown in FIG. 5(c) (I) when the fade in operation has been terminated. Thus, the characteristics of the recording level for the overlapped part is as shown in FIG. 5(c). As is clear, 5 sec. after the start of the fade out operation, the sound is atenuated more than 35 dB in such a manner that even when there is no or very little sound at the time of the fade in operation one does not feel the faded out sounds suddenly stop. This permits a very effective overlapping sound recording preferable for the auditory sense.

Figure 5D:
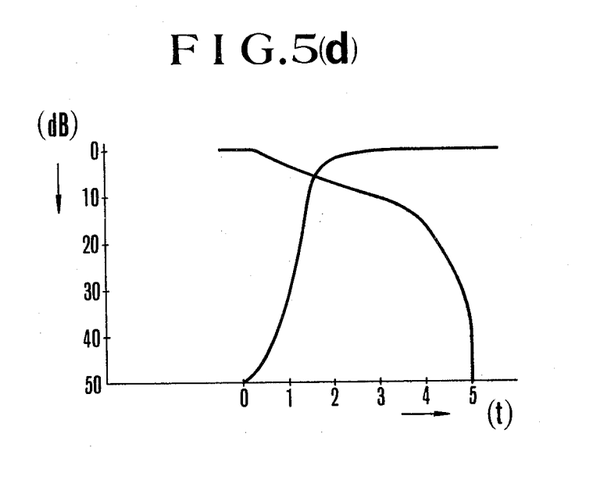
FIG. 5(d) shows a waveform for explaining another overlap operation of the embodiment shown in FIGS. 4(a) and (b).
Figure 5E:
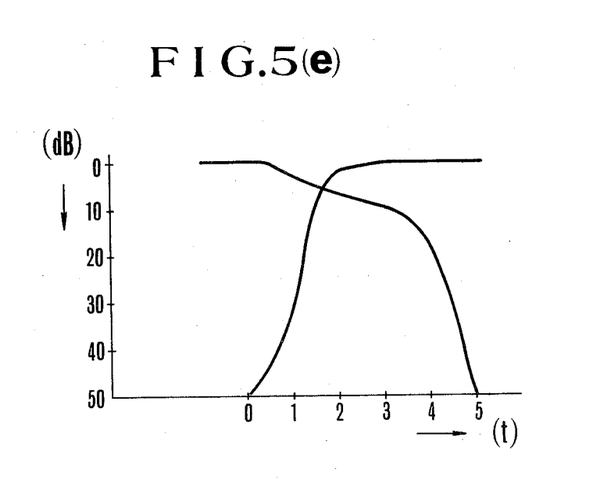
FIG. 5(e) shows a waveform for explaining further another overlap operation of the embodiment shown in FIGS. 4(a) and (b).

Hereby in order to increase the amount of overlap in the embodiment, the value of the resistance 433 in FIG. 4(a) is decreased. The fade in time then comes earlier and thus the rise of the fade in takes place earlier so that the characteristics shown in FIG. 5(d) is obtained. Hence, the amount of overlapped sounds can be increased. Further, when the value of the resistance 432 is decreased, the decrease of the fade out takes place earlier as shown in FIG. 5(e) in such a manner that the interruption of the sounds can further be improved. Also, for the circuit by means of which only the fade in, the fade out and the overlap operation are carried out, the value of the resistances 432 and 433 are selected so as to obtain the characteristics shown in FIG. 5(c), while for the circuit by means of which only the overlap operation is carried out, the most suitable values should be chosen for the auditory sense. Preferably, they should be chosen so as to obtain the characteristics shown in FIG. 5(c) or (d).

As explained above in accordance with the present invention, even when there is no sound in the next scene, the sounds of the preceding scene do not disappear suddenly. Even when there is sound, the sounds are effectively overlapped and further the sufficient overlap effect can be obtained even for a short time. This is especially effective for the sound overlap device.

During the fade in operation, the condenser 434 is quickly charged up to a voltage determined by the resistances 429, 430 and 433 and the diode 431 and then gradually discharged through the resistance 432. This is done because the transistor 410 does not assume the active state unless the base voltage reaches a predetermined level so that the sound fade in operation does not take place during the time from the start of the charge of the condenser till the base voltage reaches a predetermined level. Hence, during the fade in operation, the transistor 410 is turned on quickly in order to eliminate the above-mentioned shortcoming by quickly charging the condenser up to a predetermined level.

What is claimed is:

1. A sound overlap device for a motion picture camera comprising:

(a) fade out signal forming means for forming a fade out signal so as to start a fade out process during a photographic overlap operation;
(b) fade in signal forming means for forming a fade in signal so as to start a fade in process during the photographic overlap operation;
(c) sound-to-electric converting means for converting sound into electrical sound siganls;
(d) a sound recording member for recording the sound signals on a sound recording medium;
(e) a bias producing circuit for biasing the sound recording member with a bias of predetermined level for a fade out process and, in response to the fade in signal, for biasing the sound recording member for a fade in process with a gradually increasing bias;
(f) a sound level control circuit coupled to said converting means and to be actuated to the fade out signal for gradually decreasing the sound signal only after a predetermined period of time from the actuation and for gradually increasing the sound signal in response to the fade in signal.

2. A sound overlap device for a motion picture camera comprising:
(a) fade means for performing a photographic fade out operation and a photographic fade in operation so as to produce a photographic overlap operation; and
(b) a sound recording circuit including:
  (1) sound-to-electric converting means for converting sound into electrical sound signals;
  (2) a sound recording member for recording the sound signal on a sound recording medium,
  (3) a biasing circuit for impressing a bias on the sound recording member, and
  (4) a sound recording control circuit connected to said converting means and said sound recording member and having a sound signal level adjusting circuit and a bias level adjusting circuit, the sound signal level adjusting circuit being arranged to gradually decrease the level of the sound signal applied to the sound recording member after a predetermined period of time from the start of the photographic fade out operation by the fade means and to gradually increase the level of the sound signal applied to the sound recording member substantially at the start of the photographic fade in operation of the fade means, said bias level adjusting circuit being arranged to keep the level of the bias from the bias circuit constant during the fade out operation of the fade means and to gradually increase the level of the bias applied to the sound recording member substantially at the time of the start of the photographic fade in operation of the fade means.

3. A sound overlap device comprising:
(a) sound-to-electric converting means for converting a sound into an electrical sound signal;
(b) a sound recording member for recording the sound signal on a sound recording medium;
(c) a bias circuit for producing a bias to be supplied to the sound recording member;
(d) a bias level adjusting circuit for supplying the bias from the bias circuit to the sound recording member by maintaining a level of bias for a fade out process during an overlap sound recording operation and gradually increasing the level of the bias at the commencement of a fade in process during the overlap sound recording operation so as to supply the sound recording member with a bias the level of which increases with the lapse of time; and
(e) a sound signal level adjusting circuit for supplying the sound signal to the sound recording member at a constant level over a predetermined period of time for a fade out process during an overlap sound recording operation and, after the lapse of the period of time, for gradually decreasing the level of the sound signal supplied to the sound recording member, said sound signal adjusting circuit being arranged to begin to gradually increase the level of the sound signal supplied to the sound recording member at the commencement of a fade in process during the overlap sound recording operation.

4. A camera comprising:
(a) fade means for performing a photographic operation with fade out and fade in effects, said fade means being arranged to permit overlap photography with said fade out and fade in effects;
(b) a timer circuit for changing the output of said fade means as a function of time, from a first output state to a second output state for a fade out process during said overlap photographic operation and from the second output state to the first output state for a fade in process during the overlap photographic operation;
(c) sound-to-electric converting means for converting a sound into an electrical sound signal;
(d) a sound recording member which performs sound recording on a sound recording medium in accordance with the electrical sound signal;
(e) a sound recording level adjusting circuit for adjusting the level of the sound signal to be supplied to the sound recording member in accordance with the output of the timer circuit, said adjusting circuit being arranged to cause the level of sound recording on the sound recording medium to be lowered as a function of time when the timer circuit changes from the first output state to the second output state and to be increased when the timer circuit changes from the second to the first output state;
(f) a reset circuit for causing the output state of the timer circuit to return from the second output state to the first output state upon completion of the fade out process and for changing from the first output state to the second at the commencement of the fade in process; and
(g) monitoring means for monitoring the sound signal adjusted by said sound recording level adjusting circuit.

5. A sound fade circuit comprising:
(a) sound-to-electric converting means for converting a sound into an electrical sound signal;
(b) a sound recording member for performing sound recording on a sound recording medium in accordance with the electrical sound signal;
(c) a time constant circuit including a capacitor;
(d) a charging circuit for charging said capacitor and being arranged to become operative for carrying out a fade action;
(e) variable impedance means having an impedance variable in accordance with the output of the time constant circuit for becoming operative when the capacitor is charged to a predetermined level;

(f) an adjusting circuit for adjusting the level of the sound signal on the basis of the impedance of said impedance means; and (g) charging means in said charging circuit for substantially immediately charging the capacitor up to the predetermined level at the commencement of the fade action.

6. A sound overlap device comprising:
(a) sound-to-electric converting means for converting sound into electrical sound signals;
(b) a sound recording member for recording the sound signals on a sound recording medium;
(c) a bias circuit for biasing the sound recording member;
(d) bias level adjustment means for gradually increasing the bias level of the bias circuit so as to generate a fade in process during an overlap sound recording operation; and
(e) a sound level control circuit coupled to said sound-to-electric converting means for decreasing the level of the sound signal of the converting means after a predetermined period of time from the commencement of a fade out process and for gradually increasing the level of the sound signal for the fade in process during the overlap sound recording operation.

7. A sound overlap device comprising:
(a) sound-to-electric converting means for converting sound into electrical sound signals;
(b) a sound recording member for recording the sound signals on a sound recording medium;
(c) a bias producing circuit for biasing the sound recording member to a predetermined bias value to produce a fade out process and with a bias of a gradually increasing level to produce a fade in process during an overlap sound recording operation; and
(d) a sound level control circuit coupled to said sound-to-electric converting means for decreasing the level of the sound signal of the converting means after a predetermined period of time from the commencement of the fade out process and for gradually increasing the level of the sound signal for the fade in process during the overlap sound recording operation.

8. A sound overlap device in accordance with claim 7, wherein the sound recording level control circuit including a timer circuit operating in response to the fade out signal and a level adjusting circuit for gradually decreasing the sound recording level after the time decided by the timer circuit.

9. A sound overlap device in accordance with claim 8, wherein the motion picture camera including a pulse forming means for producing pulses whose number corresponds to the film feeding amount, while the timer circuit including a counter means for counting the pulses from the pulse forming means and the level adjusting circuit gradually decreasing the sound recording level when the counted value has reached a certain determined one.

10. A sound fade circuit for a motion picture camera comprising:
(a) fade signal forming means for forming the fade signal;
(b) a time constant circuit including a capacitor, said circuit starting to charge the capacitor in response to the fade signal;
(c) variable impedance means having an impedance variable in response to the output of the time constant circuit;
(d) a control circuit for quickly charging the capacitor to a predetermined level in response to the fade signal; and
(e) an adjusting circuit for adjusting the sound recording level in accordance with the impedance of the variable impedance means.

11. A sound fade circuit for a motion picture camera comprising:
(a) operations means;
(b) a time constant circuit including a capacitor;
(c) charge means for charging the time constant circuit by means of the operation means;
(d) variable impedance means having an impedance variable in accordance with the charge of the output of the time constant circuit;
(e) a sound recording level adjusting circuit for adjusting the sound recording level in accordance with the impedance of the variable impedance means; and
(f) control means for quickly charging the capacitor a predetermined level by means of the operation means independently of the charge means.

12. A sound fade circuit in accordance with claims 10 or 11, wherein the variable impedance means includes a transistor, the capacitor being quickly charged to the level at which the transistor is conductive.

* * * * *